United States Patent [19]
Morita et al.

[11] Patent Number: 5,908,565
[45] Date of Patent: Jun. 1, 1999

[54] LINE PLASMA VAPOR PHASE DEPOSITION APPARATUS AND METHOD

[75] Inventors: Tatsuo Morita, Soraku-gun, Japan; Robert J. Markunas, Chapel Hill, N.C.; Gill Fountian, Youngsville, N.C.; Robert Hendry, Hillsborough, N.C.; Masataka Itoh, Nara, Japan

[73] Assignees: Sharp Kabushiki Kaisha, Osaka, Japan; Research Triangle Institute, Research Triangle Park, N.C.

[21] Appl. No.: 08/383,495

[22] Filed: Feb. 3, 1995

[51] Int. Cl.$^6$ ................................................ B23K 10/00
[52] U.S. Cl. ................. 219/121.43; 219/121.44; 219/121.51; 219/121.48; 156/345; 204/298.23; 118/723 ME
[58] Field of Search .......................... 219/121.43, 121.44, 219/121.51, 121.59, 121.48, 121.52; 156/643, 646, 345; 204/298.23, 298.37, 298.12, 298.38; 118/723 R, 723 VE, 723 ME

[56] References Cited

U.S. PATENT DOCUMENTS

| | | | |
|---|---|---|---|
| 4,540,466 | 9/1985 | Nishizawa | 156/345 |
| 4,859,908 | 8/1989 | Yoshida et al. | |
| 5,053,355 | 10/1991 | von Campe | 437/114 |
| 5,136,975 | 8/1992 | Bartholomew et al. | |
| 5,149,375 | 9/1992 | Matsuyama | |
| 5,372,693 | 12/1994 | Brauer et al. | 204/298.11 |
| 5,391,232 | 2/1995 | Kani et al. | 118/715 |
| 5,628,883 | 5/1997 | Sugiyama et al. | 156/345 |

FOREIGN PATENT DOCUMENTS

| | | |
|---|---|---|
| 3923390 | 1/1990 | European Pat. Off. |
| 0-463 870 | 1/1992 | European Pat. Off. |
| 26 52 383 A1 | 5/1978 | Germany |
| WO-A-91 17285 | 11/1991 | WIPO |

OTHER PUBLICATIONS

Patent Abstracts of Japan, vol. 3, No. 59 (C–46) May 19, 1979 & JP-A-54 032184 (Tokyo Shibauradenki KK), Sep. 3, 1979, *abstract*.

Patent Abstracts of Japan, vol. 015, No. 102 (E–1043), Mar. 12, 1991 & JP-A-02 310924 (Fujitsu Ltd), Dec. 26, 1990, *abstract*.

Patent Abstracts of Japan, vol. 010, No. 199 (C–359), Jul. 11, 1986 & JP-A-61 041763 (Anelva Corp), Feb. 28, 1986, *abstract*.

*Primary Examiner*—Mark Paschall
*Attorney, Agent, or Firm*—Nixon & Vanderhye, P.C.

[57] ABSTRACT

A line plasma source (20) comprises a plasma chamber (30) configured so that plasma (32) is situated remotely and on-edge with respect to a polycrystalline silicon surface (20S) to be treated, thereby preventing damage to the surface, facilitating treatment of large substrates, and permitting low temperature operation. Active species exit the plasma chamber through a long narrow ("line") outlet aperture (36) in the plasma chamber to a reaction zone (W) whereat the active species react with a reaction gas on the polycrystalline silicon surface (e.g., to form a deposited thin film). The polycrystalline silicon surface is heated to a low temperature below 6000° C. Hydrogen is removed from the reactive surface in the low temperature line plasma source by a chemical displacement reaction facilitated by choice of dominant active species (singlet delta state of molecular oxygen). Reaction by-products including hydrogen are removed by an exhaust system (100) comprising long narrow exhaust inlet apertures (114L,114R) extending adjacent and parallel to the outlet aperture of the plasma chamber. An ionizing electric field is coupled to the plasma across a smallest dimension of the plasma, resulting in uniform production of active species and accordingly uniform quality of the thin film. The polycrystalline silicon surface to be treated is translated with respect to the plasma line source in a direction perpendicular to the outlet aperture of the plasma line source for integrating thin film quality in the direction of translation (22).

100 Claims, 10 Drawing Sheets

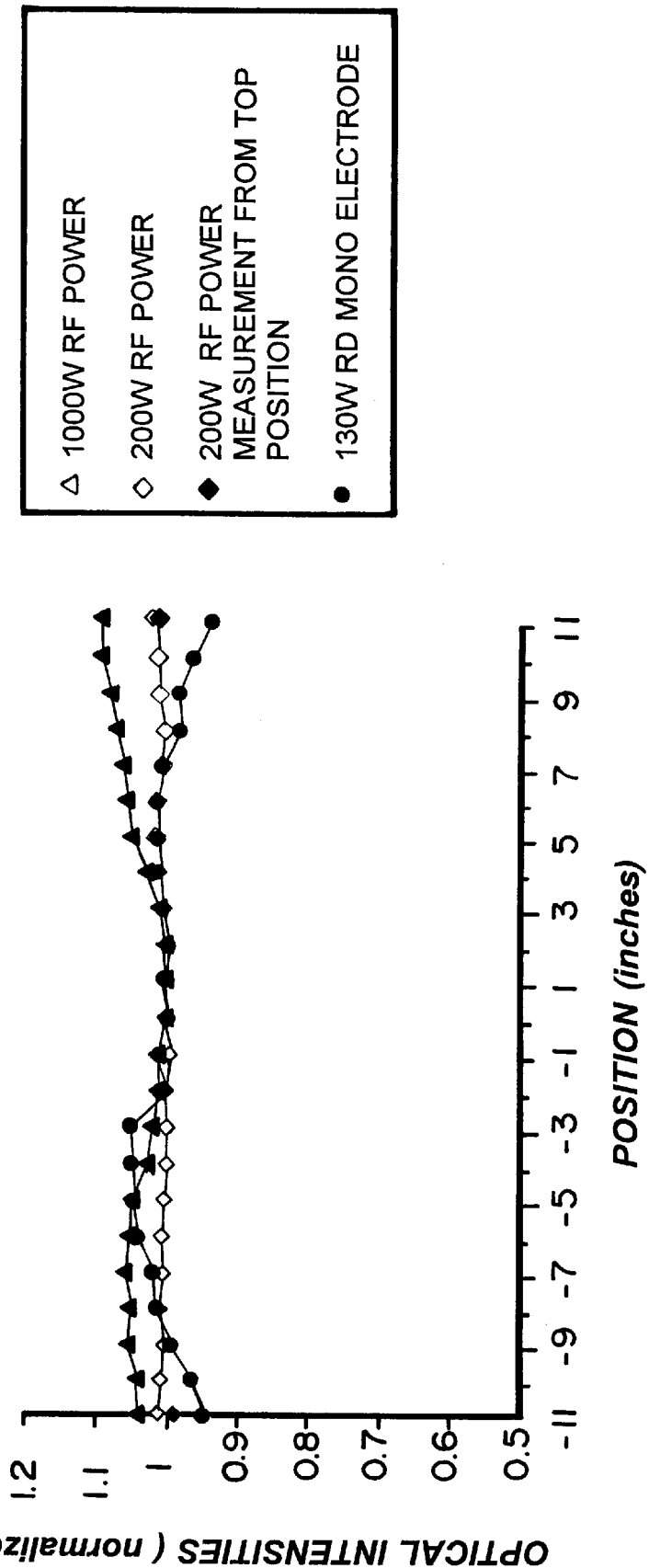

LINE PLASMA VAPOR PHASE DEPOSITION APPARATUS AND METHOD

BACKGROUND

1. Field of Invention

This invention pertains to apparatus and method for producing semiconductor devices such as integrated circuits (e.g., IC, LSI) and active matrix type liquid crystal display devices, and particularly to apparatus and method involving plasma-assisted deposition.

2. Related Art and Other Considerations

MIS (Metal Insulator Semiconductor) devices (e.g., transistors) for integrated circuits (e.g., IC, LSI) and for active matrix type liquid crystal display devices (hereinafter, referred to as an AMLCD) have a metal for which voltage can be controlled, with the metal producing an electric field in the oxide/insulator, which field extends into the semiconductor. By varying of the electric field, conductive properties of the semiconductor can be varied.

MIS devices (e.g., transistors) can be produced by layering and then processing thin films such as a gate insulating film and a gate electrode on a semiconductor substrate. In many prior art techniques, for a semiconductor device using a silicon substrate or a liquid crystal display device using a quartz substrate, silicon was oxidized at a temperature of about 1000° C. in an oxidizing atmosphere to form a silicon dioxide ($SiO_2$) film as the gate insulating film.

In recent years, devices such as AMLCD panels have been produced by forming a polycrystalline silicon film on a glass substrate, primarily using atmospheric vapor phase deposition methods and plasma vapor phase deposition methods. Unfortunately, each of these methods suffers certain disadvantages including those mentioned below.

The atmospheric vapor phase deposition methods cannot reach a sufficiently high temperature, with the result that an insulating film with low density is obtained. In view of such low density, it is subsequently necessary to subject the insulating film, after deposition, to thermal annealing at 600° C. for a long period of time.

In the plasma vapor phase deposition methods, exposing the surface of a semiconductor substrate to plasma can damage or contaminate the surface, as hereinafter explained. In the plasma vapor phase deposition methods, semiconductor devices are prepared in a plasma reactor wherein active species from a plasma react with wafer surface materials.

Conventional plasma reactors utilized for semiconductor fabrication are often parallel plate reactors having round plates. In most parallel plate reactors, the plasma is situated about 2 to 5 cm above a top surface of the sample, and the plasma is substantially coextensive with the sample top surface. Accordingly, in conventional parallel plate reactors, gas is excited to be decomposed by a plasma electric potential and simultaneously the decomposed gas is reacted with the surface of the substrate.

Other prior art plasma reactors have an essentially cylindrical tube shape wherein the plasma is further distanced from the sample top surface. Such reactors are accordingly known as remote plasma reactors or afterglow plasma reactors.

A constant challenge in semiconductor fabrication in plasma reactors is uniformity of processing over the entire sample. In a silane-based process, for example, such uniformity generally requires uniform distribution of silane in the reactor. To obtain uniform processing, it is important to uniformly couple energy to the plasma.

For inclusion in commercial products, semiconductor devices should maintain quality performance over useful life. In the case of thin film transistors (TFTs), for example, it is desirable to maintain a constant voltage threshold and gain over the useful life of the TFT. However, the presence of hydrogen at an interface of the insulator and semiconductor can jeopardize long-run performance of a MIS device such as a TFT.

In the above regard, when bonds between silicon and hydrogen are broken near an interface, the hydrogen essentially drifts away and its formerly bonded silicon becomes a trap for electrons which are tunneling from the semiconductor into the interface, thereby increasing threshold voltage and changing the transconductance of the TFT.

While the presence of hydrogen at an interface has thus been recognized as a potentially deleterious factor, prior art semiconductor processes have fortuitously minimized the influence of hydrogen. In this respect, prior art semiconductor processes typically have high temperatures (over 600 degrees centigrade for TFT fabrication for LCDs) which cause hydrogen to spontaneously desorb from the surface.

There is impetus to improve MIS production technology, such as (for example) utilizing less expensive materials and providing the MIS devices on larger silicon wafers. Concerning materials, rather expensive quartz or special glasses are necessary to withstand the high temperatures. While it is desirable to use less expensive glass (e.g, more common grades) for MIS substrates, the processing temperature must be significantly lowered to accommodate such lower grades, with the trade-off that hydrogen at the interface must somehow be otherwise removed (since temperature is no longer automatically causing hydrogen desorption).

Low temperature plasma reactive operations have previously been employed for relatively successful (e.g., relatively defectless) deposition of insulators on single crystal silicons. Significantly, MIS devices, on the other hand, are polycrystalline surfaces.

In one recent pseudo-low temperature prior art process, less expensive glass is utilized in a process of forming polycrystalline silicon by laser pulsing amorphous silicon. In such process, the peak temperature is very high, but because of its pulsed nature, the total thermal (local) load is low. However, such laser-involved process has considerable manufacturing complexity.

Other methods for forming thin films on a semiconductor substrate have recently been proposed. One method using an ECR plasma resonates electrons using a cyclotron to increase the density of plasma even at low pressure. In this ECR plasma method, a plasma chamber and a reaction chamber are separated from each other, so that excited species are produced in the plasma chamber and the resulting plasma is drawn into the reaction chamber (i.e., the surface of a semiconductor substrate). Such a structure prevents the surface of the semiconductor substrate from being exposed to the plasma, so that the surface is not likely to be damaged and excited species with a high density can be produced. Unfortunately, the method using the ECR plasma requires the confinement of the plasma with a magnetic field, which causes problems in forming uniform thin films over a large area.

Another method has been proposed in IEEE, EDL, Vol. 15, No. 2, February 1994. In this method, the damage to the surface of a semiconductor substrate caused by plasma is alleviated by interposing two other electrodes between electrodes in a parallel plate type plasma vapor phase deposition apparatus. Yet, problematically, $SiH_4$ and $O_2$ used for forming thin films on the substrate are simultaneously decomposed, so that the composition of the thin films is difficult to control and hydrogen cannot be prevented from being mixed in the thin films. Furthermore, this method makes it difficult to form uniform thin films over a two-dimensional large area.

In the unrelated field of production of architectural glass, glass has been conveyed past a linear source in a reactive sputtering process. However, reactive sputtering is not a chemical vapor deposition process and the architectural glass production technique moreover requires a rotary magnetron head.

SUMMARY

Line plasma sources and reactive process are configured for polycrystalline semiconductor processes, and are particularly suitable for treating large substrates. While usable in high temperature operations, the line plasma sources of the present invention advantageously also lend themselves to low temperature treatment operations in ranges as low as 300° C. to 350° C.

One embodiment of line plasma source comprises a plasma chamber configured so that plasma is situated remotely and on-edge with respect to a polycrystalline silicon surface to be treated, thereby preventing damage to the surface. Active species exit the plasma chamber through a long narrow ("line") outlet aperture in the plasma chamber to a reaction zone whereat the active species react with a reactive gas on the polycrystalline silicon surface (e.g., to form a deposited thin film). Hydrogen is removed from the reactive surface in the low temperature line plasma source by a chemical displacement reaction facilitated by choice of dominant active species (the singlet delta state of molecular oxygen). Reaction by-products including hydrogen are removed by an exhaust system comprising long narrow exhaust inlet apertures extending adjacent and parallel to the outlet aperture of the plasma chamber. An ionizing electric field is coupled to the plasma across a smallest dimension of the plasma, resulting in uniform production of active species and accordingly uniform quality of the thin film. The polycrystalline silicon surface to be treated is translated with respect to the plasma line source in a direction perpendicular to the outlet aperture of the plasma line source for integrating thin film quality in the direction of translation.

In another embodiment, active species travel through a non-generation section of a plasma chamber to a linear outlet aperture, with the non-generation section being non-orthogonally inclined with respect to the wafer surface.

A plasma reactor comprising a plurality of line plasma sources of the disclosed embodiments enables deposition of successive layers of thin films without removing the substrate from the reactor.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 8 is a graph showing uniformity of plasma obtained by optical measurement.

DETAILED DESCRIPTION OF THE DRAWINGS

The inventors of the present invention have determined that deposition of a film (e.g., a thin film insulator) on a polycrystalline surface cannot be obtained reasonably successfully using prior art plasma reactors and processes, and accordingly have developed novel embodiments of line plasma sources for a plasma reactor with attendant reactive process improvements. Prior to discussing the structures of the novel embodiments of line plasma sources, an exposition is provided below of phenomena subsumed by such structure.

The inventors discovered that a polycrystalline wafer is considerably more susceptible to surface damage during plasma operations (e.g, thin film deposition, e.g., insulator deposition) than is a single crystal silicon wafer. This surface damage susceptibility of polycrystalline silicon is now understood in terms of atomic orientations and bond strain. In this regard, whereas single crystal silicon has a narrow distribution of atomic orientations (i.e., highly predictable and essentially uniform positions of the atoms), polycrystalline shows much variation (i.e., multiple orientations) particularly at its surface. Importantly, some of the atoms at the polyscrystalline surface are in a very high state of strain locally. When energetic bombardment characteristic of conventional plasma systems is applied to such already-strained atoms, bonds break and reform as a defect. The defects are manifested in the performance of the semiconductor devices. In view of the discovery of surface damage susceptibility of polycrystalline silicon, the inventors sought to move the plasma (with its kinetically energic species) away from the polycrystalline silicon using a remote plasma configuration.

Moreover, in contrast to hydrophobic single crystal silicon wafers, polycrystalline silicon surfaces (e.g., for TFTs) are on hydrophilic glass substrates which typically bring considerable water adsorbed thereon into a reactor. In view of the presence of water (and, consequentially, of hydrogen) and potential defects resulting therefrom, the water/hydrogen must be removed. For a low temperature process, conventional high-temperature desorption of hydrogen is of no avail, with the result that there must be a further technique of hydrogen removal.

STRUCTURE: FIRST EMBODIMENT REACTOR WITH LINE PLASMA SOURCE

Figure 1:
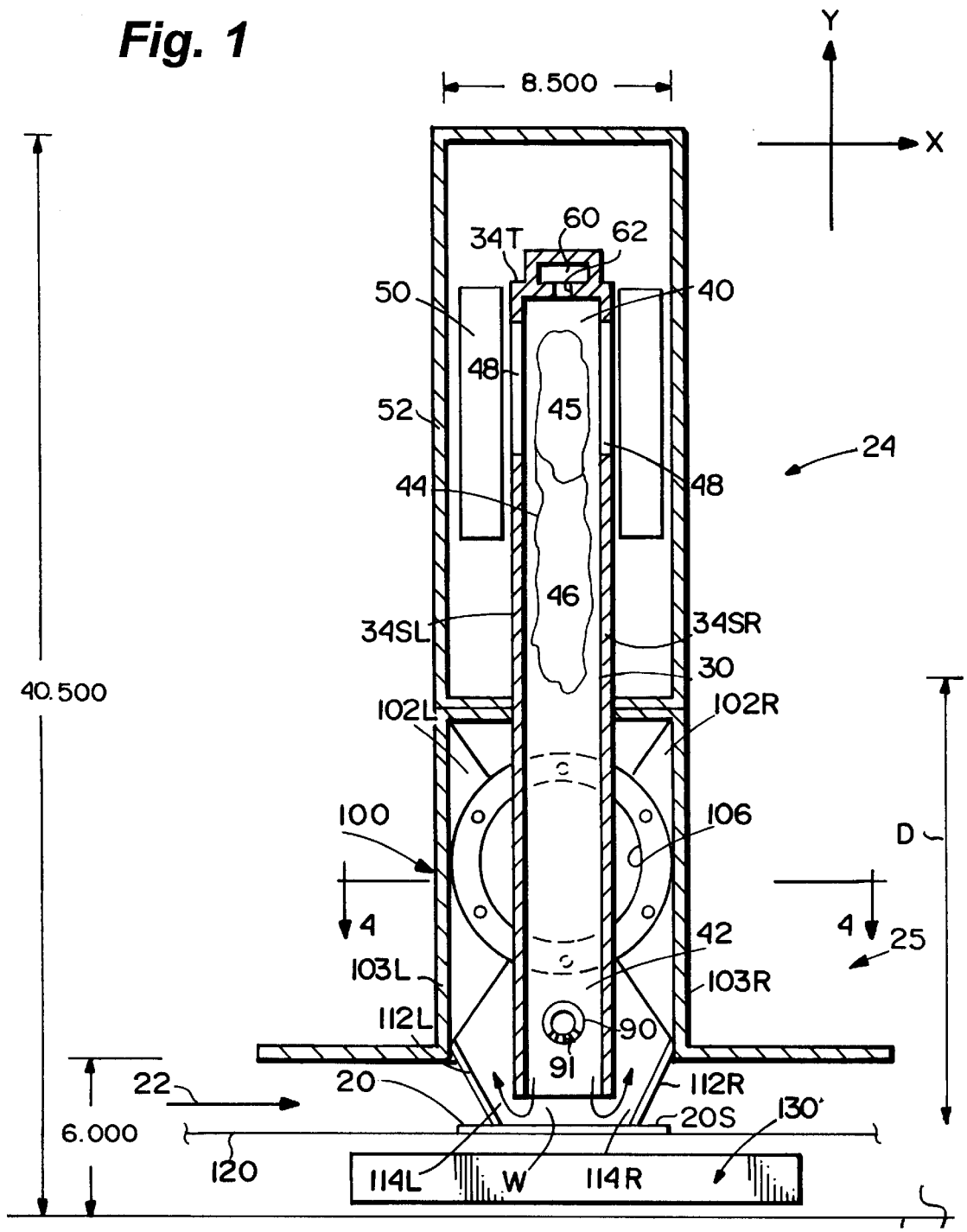
FIG. 1 is a cross sectional end view of a plasma reactor including a line plasma source according to an embodiment of the invention.

In FIG. 1, a semiconductor wafer 20 with a top surface 20S to be treated is shown being transported in a transport direction (depicted by arrow 22) relative to an embodiment of a plasma source 24 in a plasma reactor 25 of the present invention. As used herein, "treatment" of a surface includes one or more of cleaning, etching, direct oxidation, deposition (e.g., of oxides or nitrides) of/on a surface, such as deposition of a thin film layer, for example an oxide (e.g., gate oxide) layer.

Plasma source 24 includes a plasma chamber 30. Plasma chamber 30 includes walls for defining an essentially elongated narrow rectangular volume. As further understood with additional reference to FIG. 2, plasma chamber 30 includes chamber sidewalls 34SL and 34SR, chamber end walls 34E, and chamber top wall 34T. A face of plasma chamber 30 opposite chamber top wall 34T is open, forming chamber outlet aperture 36. In the illustrated embodiment, chamber outlet aperture 36 is formed in a plane parallel to wafer top surface 20S. The walls of plasma chamber 30 are preferably formed from stainless steel which may be structurally ribbed and may, e.g., for sake of maintenance, have a removable liner.

Figure 3:
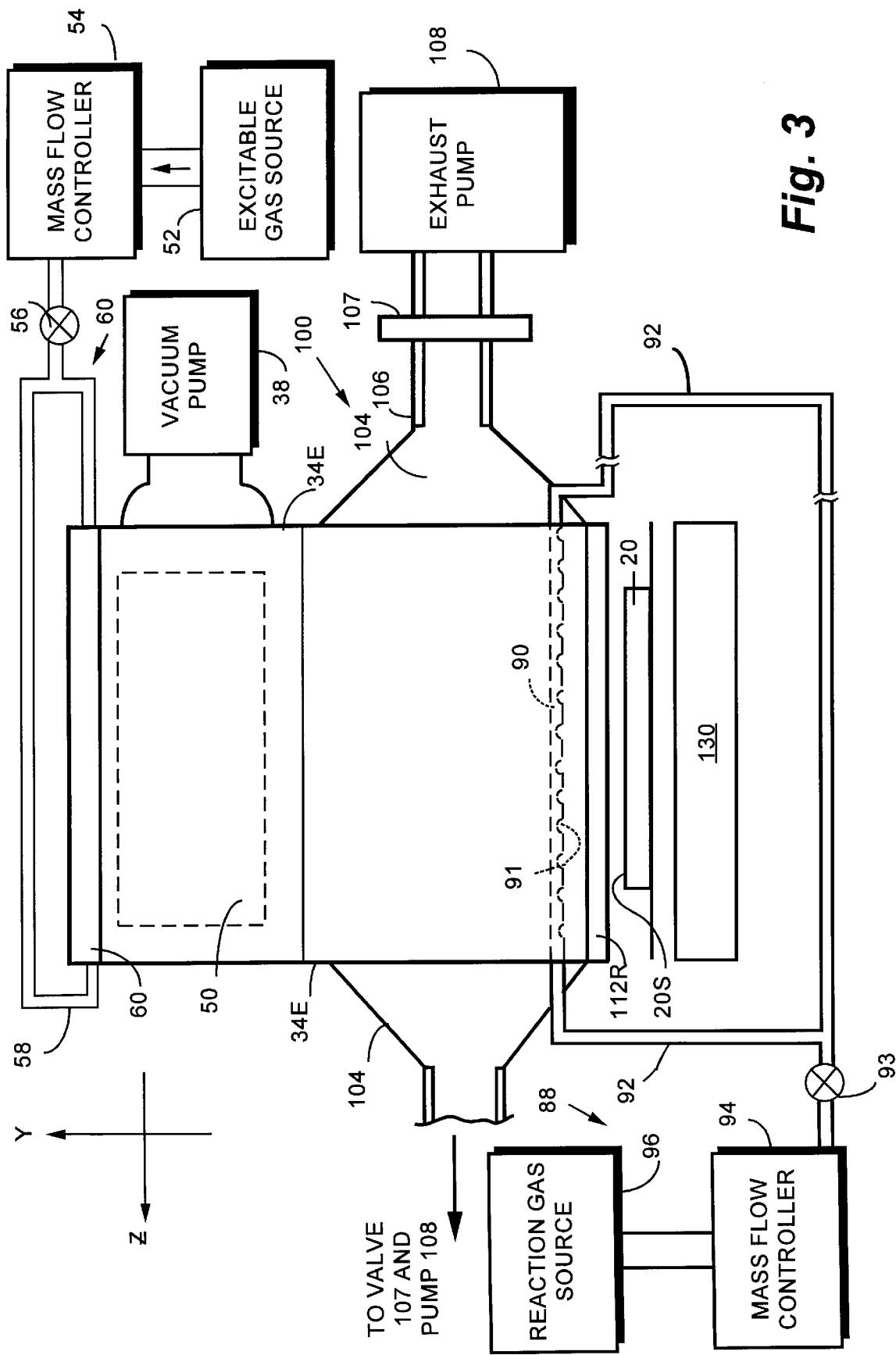
FIG. 3 is a right side view of the plasma source of FIG. 1.

As shown in FIG. 3, plasma chamber 30 is connected to vacuum pump 38 which provides a vacuum in plasma chamber 30. In addition to providing a vacuum envelope, the walls of plasma chamber 30 also provide an electrical ground reference.

Figure 2:
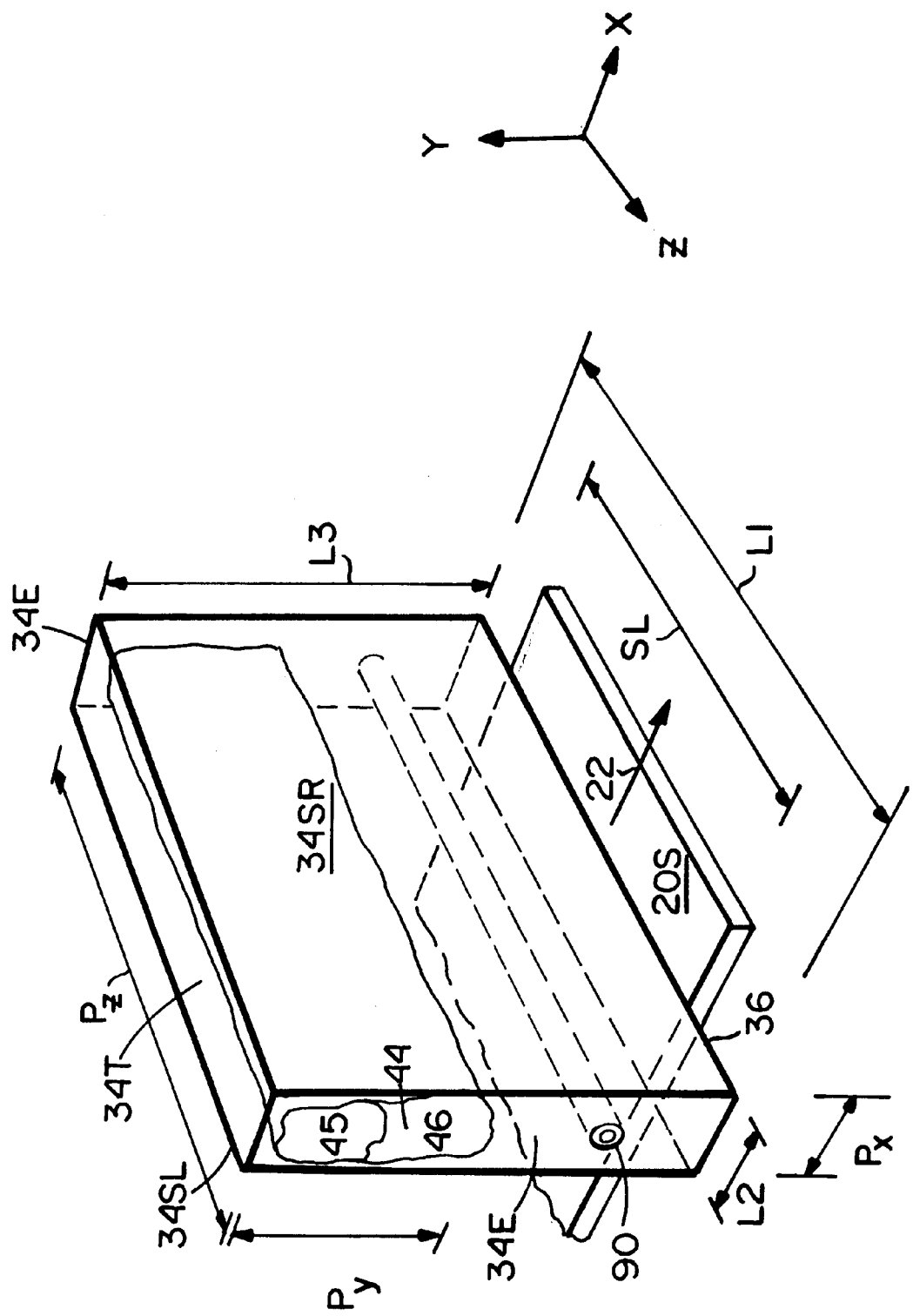
FIG. 2 is a schematic depiction of a plasma chamber of the plasma source of FIG. 1 in context of a Cartesian reference frame.

FIG. 2 orients plasma chamber 30 with reference to a Cartesian chamber reference frame having axes X, Y, and Z. In the Cartesian system of FIG. 2, wafer top surface 20S lies in a plane parallel to the X-Z plane, with the transport direction 22 of the wafer being in the +X direction. The Z direction is referenced herein as being the transverse direction; the Y direction is orthogonal to wafer top surface 20S.

As further understood from FIG. 2, plasma chamber 30 has an internal length L1 along the Z axis (i.e., in the transverse direction); an internal length L2 along the X or transport direction; and an internal length L3 along the Y direction. Similarly, chamber outlet aperture 36 has the length L1 along the Z axis (i.e., in the transverse direction) and the length L2 along the X or transport direction. An aspect ratio of length L2 to L3 is in a range of from 1:3 to 1:10, with the lengths L2 and L3 being 4 inches and 36 inches, respectively, in the illustrated embodiment. The length L1 can be as long as 48 inches, for example.

As shown in FIG. 2, the longest dimension L1 of outlet aperture 36 exceeds a length SL (the length SL being an extent of the surface to be reacted in the wafer transverse dimension). In particular, L1=SL+2E, where E (known as a transverse edge margin) is preferably 2.5 inches.

In view of the aspect ratio of chamber outlet aperture 36 in the Z direction, and particularly the narrow elongated shape of outlet aperture 36, plasma source 24 is herein referred to as a "line" or "linear" source. The "line" of plasma source 24 extends in the transverse direction (i.e., in the Z direction).

Internally, plasma chamber 30 is functionally divided into a plasma region 40 and a drift region 42. Plasma region 40 includes a volume 44 of radiative species which includes plasma 45 (wherein active species are generated) and an afterglow 46 (in which radiative active species undergoing decay are in transport). Drift region 42 is a portion of plasma chamber 30 between radiative volume 44 and outlet aperture 36 through which non-radiative active species travel. Drift region 42 serves to filter out non-selected active species (e.g., short lived active species) and to provide opportunity for collisions of highly kinetic active species, thereby preventing damage to wafer surface 20S. In addition, drift region 42 with its flow therein helps lessen backward flow of reactive gas toward plasma 45.

In plasma region 40, chamber sidewalls 34SL and 34SR are provided with opposed quartz dielectric windows 48. As shown in FIG. 1, plasma source 24 further comprises an electric field applicator 50. Field applicator 50 is positioned outside of plasma chamber 30 for the purpose of coupling an electric field through plasma 45 (in plasma region 40) in the X direction in the vicinity of quartz windows 48. Field applicator 50 extends along approximately a top half of plasma chamber 30 in the Y direction. Field applicator 50 is encased in shielding 52. Differing embodiments of field applicator 50 are described hereinafter.

Plasma source 24 includes a delivery system 60 for supplying an excitable gas which will be used as the excited gas (see FIG. 3). A source 52 of excitable gas is connected to an input of mass-flow controller 54, the output of mass-flow controller 54 being connected (via valve 56) by conduit 58 to excitable gas discharge manifold 60. Excitable gas discharge manifold 60 is positioned on plasma chamber top wall 34T and extends along the Z dimension. Excitable gas is introduced into plasma chamber 30 through orifices 62 provided on the underside of excitable gas discharge manifold 60.

Plasma source 24 also includes a reaction gas delivery system 88 (see FIG. 3). Reaction gas delivery systems includes a reaction gas discharge manifold 90 extending through drift region 42 of plasma chamber 30. A major axis of reaction gas discharge manifold 90 extends in the transverse direction (i.e., parallel to the Z axis). Reaction gas discharge manifold 90 has orifices 91 circumferentially located around a lower 180 degrees thereof. As also shown in FIG. 3, reaction gas discharge manifold 90 communicates through plasma chamber end walls 34E with silane conduits 92, which in turn are connected (via valve 93) to an outlet of mass-flow controller 94. Mass-flow controller 94 has its inlet connected to a source 96 of reaction gas.

In addition to plasma source 24, plasma reactor 25 also comprises an exhaust system 100. Exhaust system 100 includes an exhaust plenum 102 having two exhaust plenum sections 102L, 102R. Plenum 102 is formed by plenum walls, including plenum outer walls 103L and 103R. As shown in FIG. 1, exhaust plenum section 102L abuts a lower portion of plasma chamber sidewall 34SL while exhaust plenum section 102R abuts a lower portion of plasma chamber sidewall 34SR. Thus, a lower portion of plasma chamber 30, including drift region 42, is sandwiched by exhaust plenum sections 102L and 102R. As shown in FIG. 3, at front and rear portions thereof exhaust plenum sections 102L and 102R join to form exhaust manifolds 104. As shown in FIG. 3, exhaust manifolds 104 wrap around plasma chamber end walls 34E, and communicate with first ends of respective exhaust conduits 106. Each exhaust conduit 106 has a butterfly valve 107 installed medially thereon and connects to exhaust pump 108. Butterfly valve 107 is controlled by an unillustrated pressure controller, which controller is connected in conventional manner to a pressure transducer (e.g., capacitance manometer) in plasma chamber 30, for controlling vacuum pumping speed.

Figure 4:
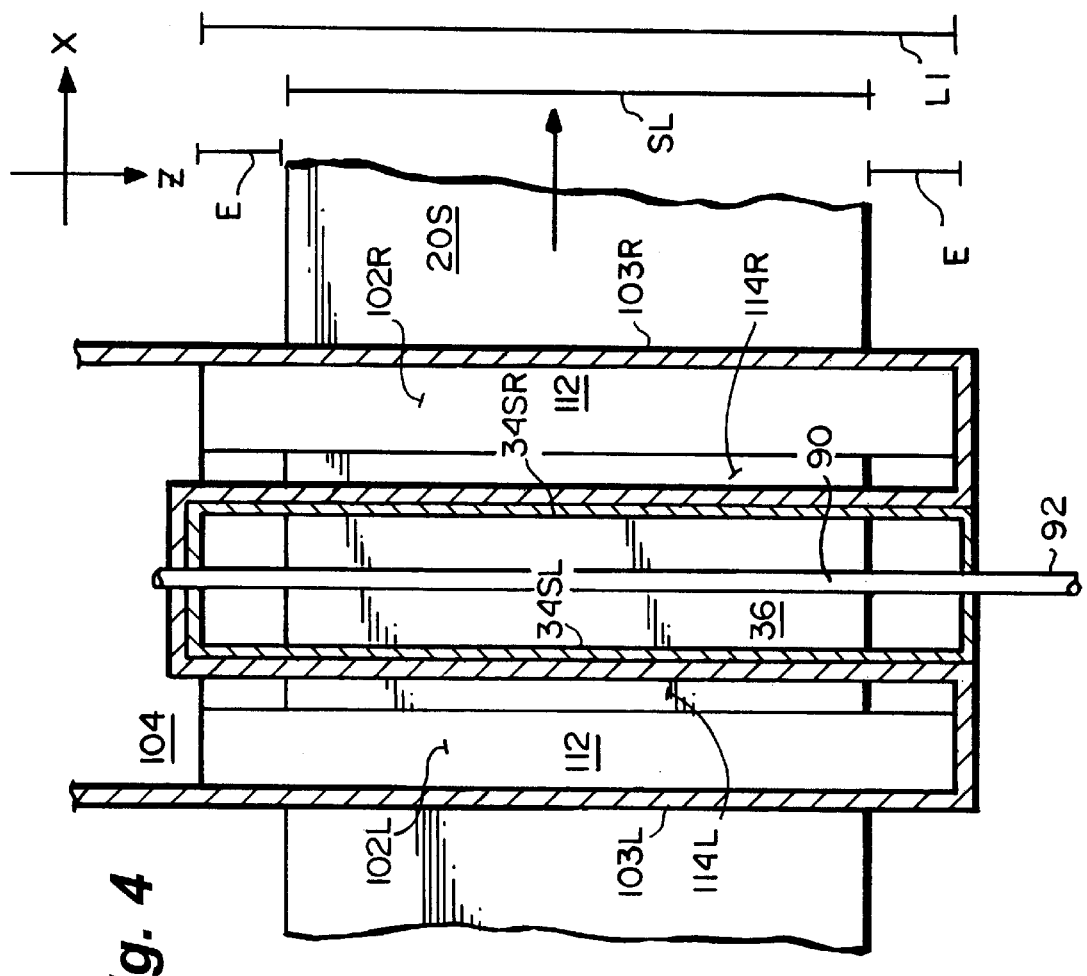
FIG. 4 is a top cross-sectional view of the plasma source of FIG. 1 taken at line 4—4 of FIG. 1.

At lower ends thereof, plenum outer walls 103L, 103R have angularly depending baffles 112L, 112R, respectively attached thereto. An exhaust inlet aperture 114 is provided between each baffle 112 and the plasma chamber outlet aperture 36. Exhaust inlet aperture 114L is formed between baffle 112L and plasma chamber outlet aperture 36; exhaust inlet aperture 114R is formed between baffle 112R and plasma chamber outlet aperture 36. That is, plasma chamber outlet aperture 36 is situated between the first and second exhaust inlet apertures (e.g., between apertures 114L and 114R). As shown for example in FIG. 4, plasma chamber outlet aperture 36, exhaust inlet apertures 114 are long, narrow apertures having a major dimension extending in the transverse direction (i.e., Z axis). Exhaust apertures 114 extend adjacent and parallel to the plasma chamber outlet aperture 36 in the plasma chamber. The space above wafer surface 20S, but below plasma chamber outlet aperture 36 and between baffles 112L, 112R is referred to as a deposition zone or reaction zone W. It is desired to have minimum clearance of baffles 112R, 112L relative to wafer surface 20S, thereby minimizing leakage and infiltration.

As further shown in FIG. 1, plasma reactor 25 includes a transport system comprising conveyor 120. Wafer 20 is transported in direction 22 by conveyor 120. Conveyor 120 can be of any suitable type, including a conveyor on which wafer 20 sits or a conveyor which engages wafer 20 in apertures formed therein.

As wafer 20 is transported past plasma chamber outlet aperture 36, a heating operation is performed by heating system 130. Heating system 130 comprises, in one embodiment, a hot radiative block (e.g., with embedded heating elements) such as that well-known in the art. Heating system 130 heats wafer 20 to a temperature less than 6000° C., even as low as a range of from 300° C. to 350° C. when desired. In one embodiment, heating system 130 is moved under chamber outlet aperture 36 in direction 22 to accompany wafer 20.

Figure 7:
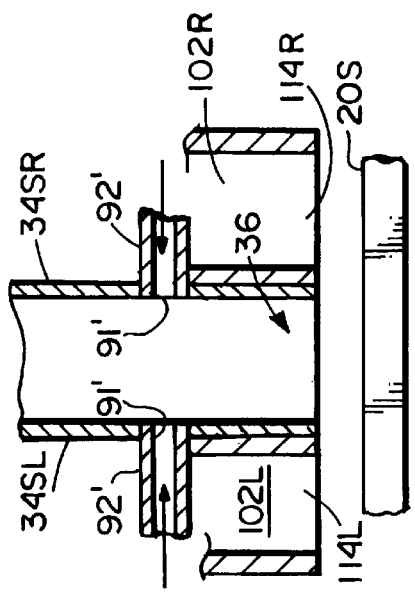
FIG. 7 is a cross-sectional end view of a portion of a plasma source showing an alternate embodiment of a reaction gas delivery system.

It should be understood that various modifications can be made with respect to one or more of the foregoing systems. For example, the reaction gas delivery system and the exhaust system can be reconfigured so that the reaction gas is introduced through orifices 91' in opposed plasma chamber sidewalls 34SL, 34RL in the manner shown in FIG. 7. Reaction gas is supplied to orifices 91' through conduits 92'.

Figure 6:
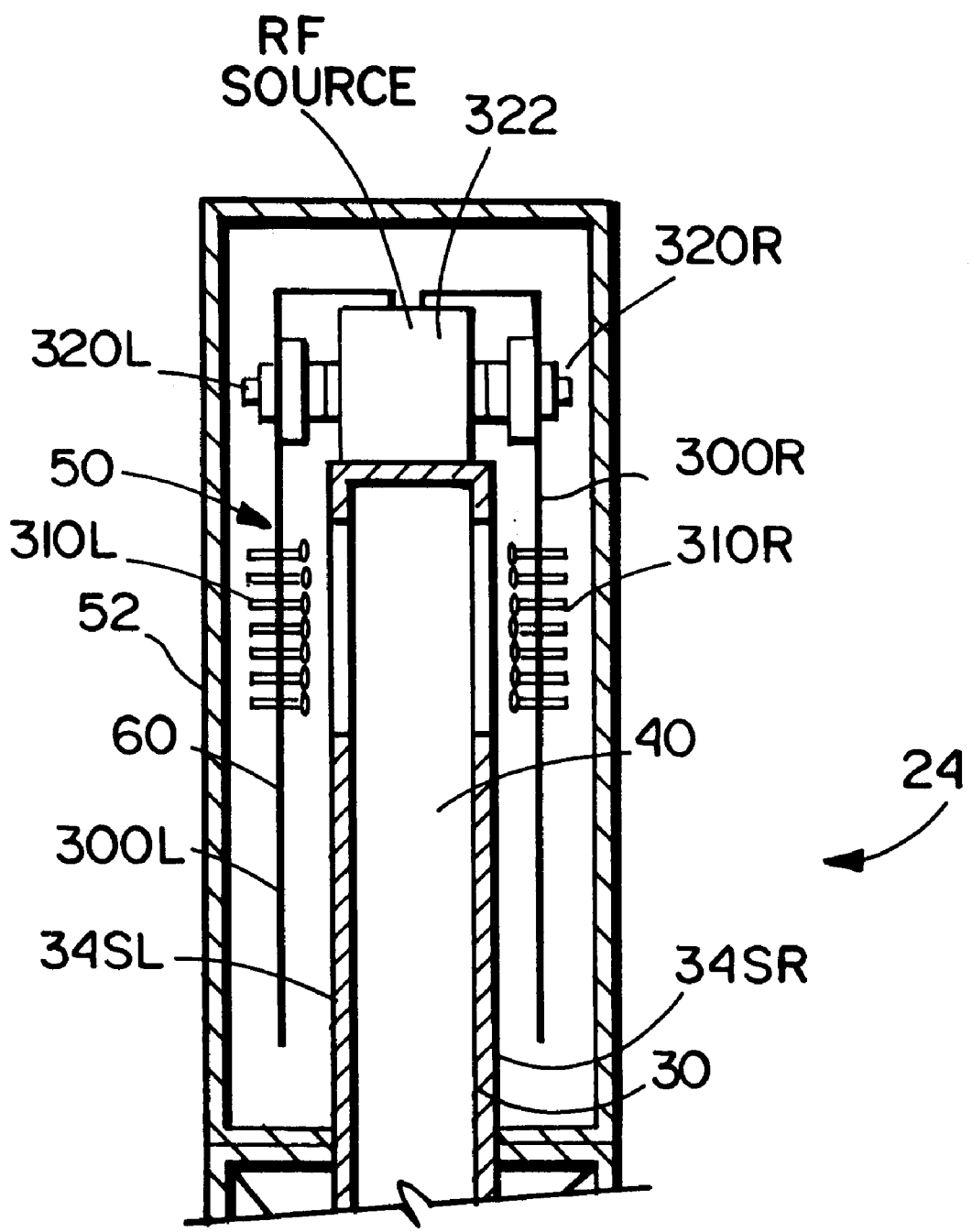
FIG. 6 is a cross-sectional end view of a portion of a plasma source showing a first embodiment of a field applicator.

One embodiment of field applicator 50 is shown in FIG. 6. Field applicator 50 of FIG. 6 includes two strip line resonators 300L and 300R; oscillator tube assemblies 310L and 310R; tuning screw arrays 320L and 320R; and, an RF source 322. Strip line resonantors 300L and 300R extend the full length L1 of plasma chamber 30 in the Z direction. At intervals in the Z direction, each resonator 300L, 300R has one of the respective oscillator tube assemblies 320L, 320R coupled thereto. Oscillator tube assemblies 310L, 320R are, in turn, connected to RF source 322. For example, four oscillator tube assemblies 310L, 310R may be provided spaced apart in the Z dimension. Tuning screw arrays 320L, 320R are used to set capacitances to adjust the coupling electric field.

In some modes of operation, RF source 322 is operated at 13.56 MHz. For such low frequency, resonators 300L, 300R must be suitably long in the Y direction. In higher frequency modes, such as 100 MHz, the extent of resonators 300L, 300R in the Y direction is relatively shorter.

Advantageously, operation of RF source 322 in a higher frequency mode on the order of 100 MHz can reduce voltage and also increase reaction rate, and accordingly increase throughput rate of wafers 20. For example, by increasing from 13.56 MHz to 100 MHz, the deposition rate can be increased from 20 Angstroms per minute to 84 Angstroms per minute. In contrast to prior art reactors wherein high frequency operation posed significant problems, the geometry and operating parameters of line source 24 facilitates successful high frequency operation.

The operating frequency of RF source 322 can be set to obtain a predetermined figure of merit for the treatment, such as for the deposition of a desirable quality of the layer. The figure of merit is obtained by dividing a voltage across the drift region by a number of mean free paths. As used herein, mean free path is the mean distance between collisions.

In general operation, excitable gas from source 52 is applied at a constant flow rate (via mass-flow controller 54 and conduit 58) to plasma chamber 30. In plasma chamber 30, the excitable gas is excited by field applicator 50, creating plasma 45 in plasma region 40. The plasma thus created has a plurality of types of excitable species (oxygen atoms ($O^*$), oxygen molecules ($O_2^*$), oxygen ions ($O^+$, $O^{2+}$), argon ions ($Ar^+$), and the like in a high energy state).

While travelling toward reaction zone W, most of the ions contained in the excited species are neutralized, thermalized, or deactivated (e.g., by colliding with the walls of plasma chamber 30). As a result, the singlet delta state of molecular oxygen is the dominant active species which travels to drift region 42 wherein it is mixed with reaction gas introduced through orifices 91 in reaction gas discharge manifold 90. The mixed gas then exits through chamber outlet aperture 36 so that the mixed gas undergoes a vapor phase reaction at/with wafer surface 20S in the vicinity of reaction zone W. While being treated (e.g., reacted), wafer 20 is heated to a predetermined temperature by heating system 130. Depending upon parameters including the nature of the gases employed, the vapor phase reaction results in either a cleaning, etching, oxidation, or deposition (e.g., of a thin film) relative to wafer surface 20S. After the reaction, exhaust gas and unreacted gas are removed by exhaust system 100, and particularly by exhaust pump 108 acting via conduit 106, valve 107, plenum 102, and exhaust inlet apertures 104.

As shown in FIG. 2, volume 44 of radiative species has a projection of length $P_Z$ along the Z axis, a projection of length $P_Y$ along the Y axis, and a projection of length $P_X$ along the X axis. The length $P_X$ is significantly shorter than lengths $P_Y$ and $P_Z$, with the ratio $P_X:P_Y$ being in a range from about 1:3 to 1:10. The length $P_Z$ and the length $P_Y$ of chamber outlet aperture 36 can be varied or adjusted so as to perform a desired treatment on a wafer in accordance with experimental results.

In the illustrated embodiment, $P_X$ is preferably 4 inches. The length $P_Y$ is a function of numerous factors, including the pressure in plasma chamber 30 and the flow rate of excitable gas. Moreover, the length $P_Y$ may depend upon the particular operation (treatment) being implemented at the moment. For example, volume 44 may extend essentially the full extent of chamber 30 along the Y axis for a cleaning treatment. The length $P_X$ and the length $P_Y$ of chamber outlet aperture 36 can be varied or adjusted so as to perform a desired treatment on a wafer in accordance with experimental results.

Since plasma 45 has its shortest dimension projected onto wafer surface 20S, plasma 45 is said to lie in an "on-edge" orientation with respect to wafer surface 20S. Moreover, in view of the ratios $P_X:P_Y$ and $P_X:P_Z$, plasma 45 is said to be a "flat" plasma volume.

Moreover, as shown in FIG. 1, radiative volume 44 is separated along the Y axis by a distance D from wafer surface 20S. Other than for cleaning treatments, the distance D is typically preferably between 6 and 12 mean free paths and is on the order of about 20 inches. In view of such typical separation, plasma 45 is remotely located from wafer surface 20S and accordingly plasma reactor 25 is denominated as a remote reactor.

SECOND EMBODIMENT REACTOR WITH LINE PLASMA SOURCE

Figure 5:
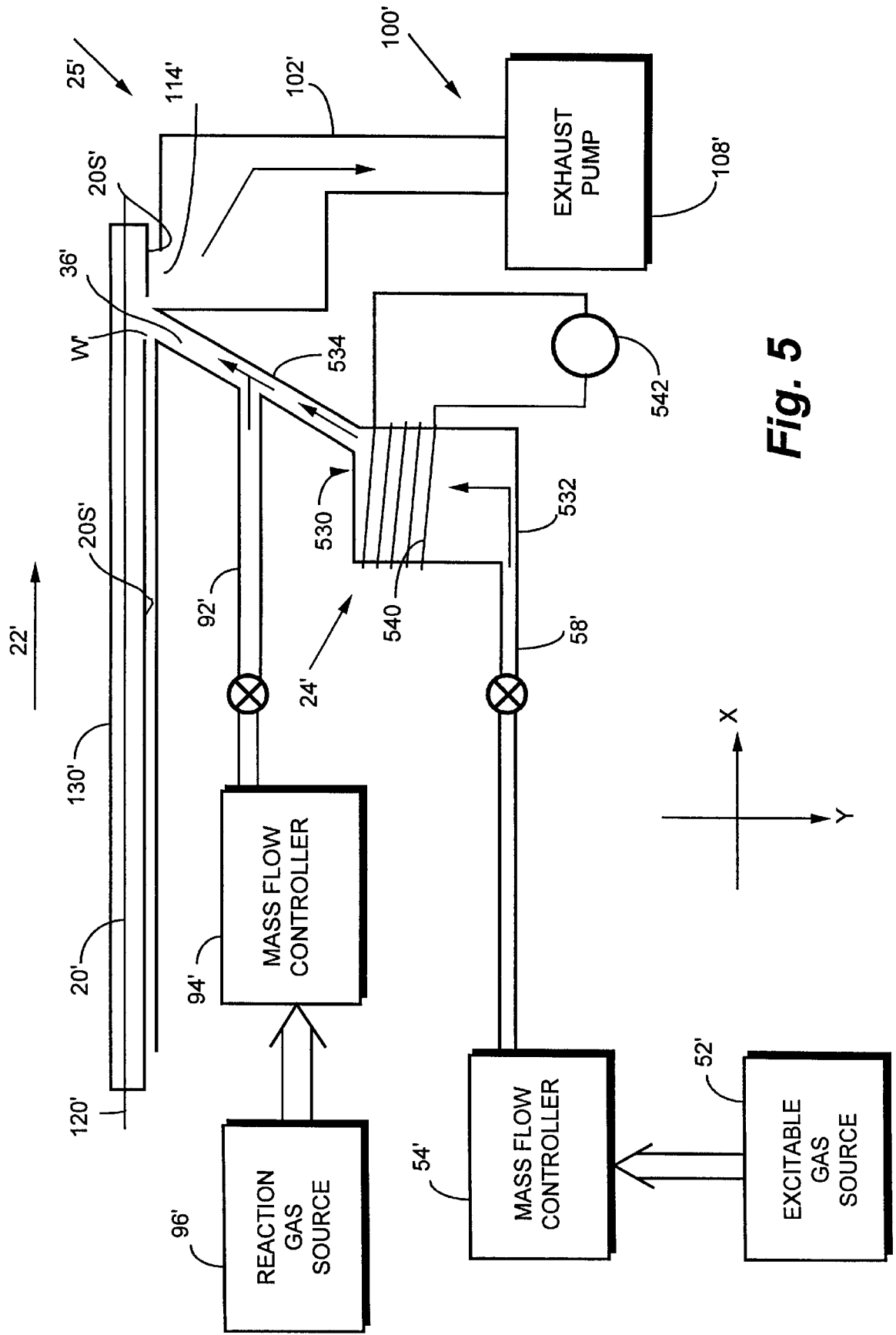
FIG. 5 is a schematic cross-sectional view of a plasma reactor according to a second embodiment of the invention.

FIG. 5 shows a plasma reactor 25' according to a second embodiment of the invention. In FIG. 5, reactor elements similar to that of the FIG. 1 embodiment bear similar (but primed) reference numerals. Some aspects of reactor 25', such as its vacuum system, are not specifically shown but are understood by analogy to reactor 25 of FIG. 1.

As understood from FIG. 5, reactor 25' positions wafer 20' in an inverted orientation (e.g, wafer 20' is conveyed upside-down past reaction zone W'). Reactor 25' includes line plasma source 24' with a plasma chamber 530 which comprises an elongated rectangular plasma generation section 532 and a non-generation section 534. Both plasma generation section 532 and non-generation section 534 extend considerably in the Z direction (i.e., in a direction perpendicular to the plane of FIG. 5).

As shown in FIG. 5, plasma generation section 532 has an electrical winding or coil 540 wrapped thereabout, the electrical winding being connected to an RF source 542.

In a high power mode of operation, coil 540 additionally provides a magnetic field component.

Non-generation section 534 is angularly inclined with respect to axis Z (i.e., to surface 20S' of wafer 20') and has a chamber outlet aperture 36'. In view of the relatively greater length of chamber outlet aperture 36' in the Z direction than in the X direction, plasma chamber outlet aperture 36' (like aperture 36 of reactor 25) is viewed as an essentially linear aperture.

Exhaust system 100' includes exhaust plenum 102' connected to exhaust pump 108'. As shown in FIG. 5, plenum 102' is essentially quadrilateral (e.g., square) in cross-section, having an exhaust inlet aperture 114' extending (in the Z direction) at a corner thereof proximate plasma chamber outlet aperture 36'.

OPERATION

In the line plasma sources 24 and 24' of the present invention, only gas which is required to be excited is excited in plasma region 40 with minimal direct excitation of the reaction gas(es). The thin film thus formed is very stable in terms of its composition and has high density.

The separate or remote positioning of plasma 45 from reaction zone W and from the wafer surface 20S enables ions or the like having high energy (e.g., high kinetic energy ions) to be neutralized and/or thermalized before reaching zone W and wafer surface 20S, thereby preventing damage to wafer surface 20S.

Plasma line sources 24 and 24' operate in a low temperature (e.g., less than 600° C., and even as low as a range of from 300° C. to 350° C.) process, with the result that hydrogen at the surface of the sample 22 is not automatically desorbed (as occurs in high temperature plasma reactors). Rather, in the present invention, hydrogen at the surface of sample 22 is removed by a displacement reaction facilitated by the selection of the singlet delta state of molecular oxygen to be the dominant active species. Accordingly, reference herein to the "dominant" active species is to the singlet delta state of molecular oxygen, which is a metastable state.

Advantageously, the selected dominant active species is not de-excited by colliding with the walls of plasma chamber 30, nor is it de-excited by collisions in the gas phase. Thus, the selected species will survive transit from the plasma region to the surface of sample 22. Such survivability is important since the plasma region is remote from sample 22 in order to avoid kinetic bombardment of sample surface 22S and attendant surface defects, as aforementioned.

One form of the displacement reaction facilitated by plasma line sources 24 and 24' is as follows:

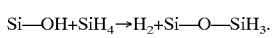
$$Si{-}OH + SiH_4 \rightarrow H_2 + Si{-}O{-}SiH_3.$$

First, active oxygen from the remote source 24 or 24' reacts with Si—H to form Si—OH. Then, with silicon bound to an OH group at sample surface 22S, incident silane $SiH_4$ removes hydrogen bonding from oxygen, so that the oxygen bridges two silicons. Then the outermost silicon is hydrogenated, which hydrogen bond will be the next point of oxidation followed by displacement, thereby driving hydrogen from the surface.

Although the foregoing operation and displacement reaction have been illustrated in terms of monosilane, it should be apparent to the man skilled in the art that disilane can also be employed advantageously with proportionately less introduction of hydrogen.

While the displacement reaction advantageously removes hydrogen from the surface, the free hydrogen remaining as a process by-product could potentially cause undesirable complications. Specifically, if hydrogen (either in the form of free hydrogen, OH, or water) were to get into the plasma, the hydrogen might be activated by the plasma. Some of the activation reactions for hydrogen produce hot hydrogen.

Hot hydrogen is a very high velocity hydrogen atom. While hot hydrogen reacting with a sample surface in a high temperature process will be desorbed, in a low temperature process (such as that of the present invention) the hot hydrogen has enough excess energy to penetrate below the first couple of layers of surface atoms. Having a low cross section for scattering, the hot hydrogen can penetrate below the surface and then suffer a collision with the lattice. In the collision the hot hydrogen can react with an established silicon-oxygen bond, resulting in an SiOH and dangling bond of silicon. While the displacement reaction eferenced above can be relied upon to remove hydrogen at he sample surface, the displacement reaction does not appreciably affect below the surface and cannot counteract the effect of hot hydrogen.

Advantageously, line sources 24 and 24' of the present invention avoid by-product complications, such as that described with hot hydrogen, by providing exhaust systems in close proximity to reaction zones W, W' and plasma chamber outlet apertures 36, 36'. The linear dimensioning of both plasma chamber outlet apertures and exhaust inlet apertures provide a one dimensional flow field that allows control both of reactant distribution in and process by-product out in a way that is relatively insensitive to the size of the sample.

The fact that the plasma chamber 30 extends in the Z direction for a distance E further than wafer 20 (see FIG. 4) avoids any boundary conditions at reactor end walls 34E. With end walls 34E relatively far removed from the bulk of the operative plasma 45, boundary effects extend only minimally into plasma chamber 30 but not to an extent to affect reaction with respect to wafer 20, thereby minimizing non-uniformity of reaction.

By producing an essentially flat volume of plasma 45, the line sources of the present invention achieve a uniform distribution of excited species which enhances reaction results (e.g., quality of material deposited). The invention thus avoids prior art problems of large plasma volumes in which generation of active species occurs primarily at edges of the volume and not in the volume center.

OPERATION: EXAMPLE

In one example of utilization of line plasma source 24, silicon dioxide ($SiO_2$) is deposited on a polycrystalline silicon surface 20S borne by a glass substrate. A mixture of oxygen and argon is used as the excitable gas, for example 20% oxygen in argon applied at a flow rate of 300 sccm (standard cubic centimeters per minute). A mixture of silane ($SiH_4$) and nitrogen is used as the reaction gas, for example 2% silane in nitrogen applied at a rate of 300 sccm. Plasma reactor 20 is kept under a pressure of 100 mTorr to 1 Torr and is supplied with an RF power of 200W at a frequency of 13.56 MHz. Heating system 130 heats wafer 20 to a temperature below 600° F.

FIG. 8 shows the uniformity of plasma obtained in a reactor such as reactor 25'. Uniformity of plasma is determined by optical measurement. As is understood from FIG. 8, the uniformity of plasma within ±5% is achieved with respect to a length of 23 inches of thin film.

It should be understood that other excitable gases and reaction gases could be utilized. For example, for producing $SiO_2$, pure oxygen or oxygen diluted in Helium could alternatively be used as the excitable gas and silane diluted in helium could be alternatively be used as the reaction gas.

Moreover, it should be understood that line plasma sources 24 and 24' can be used for formation of films other than $SiO_2$, such as a $Si_3N_4$ thin film (for which $N_2/Ar$, $NH_4$ or the like can be used as the excitable gas).

Figure 10A:
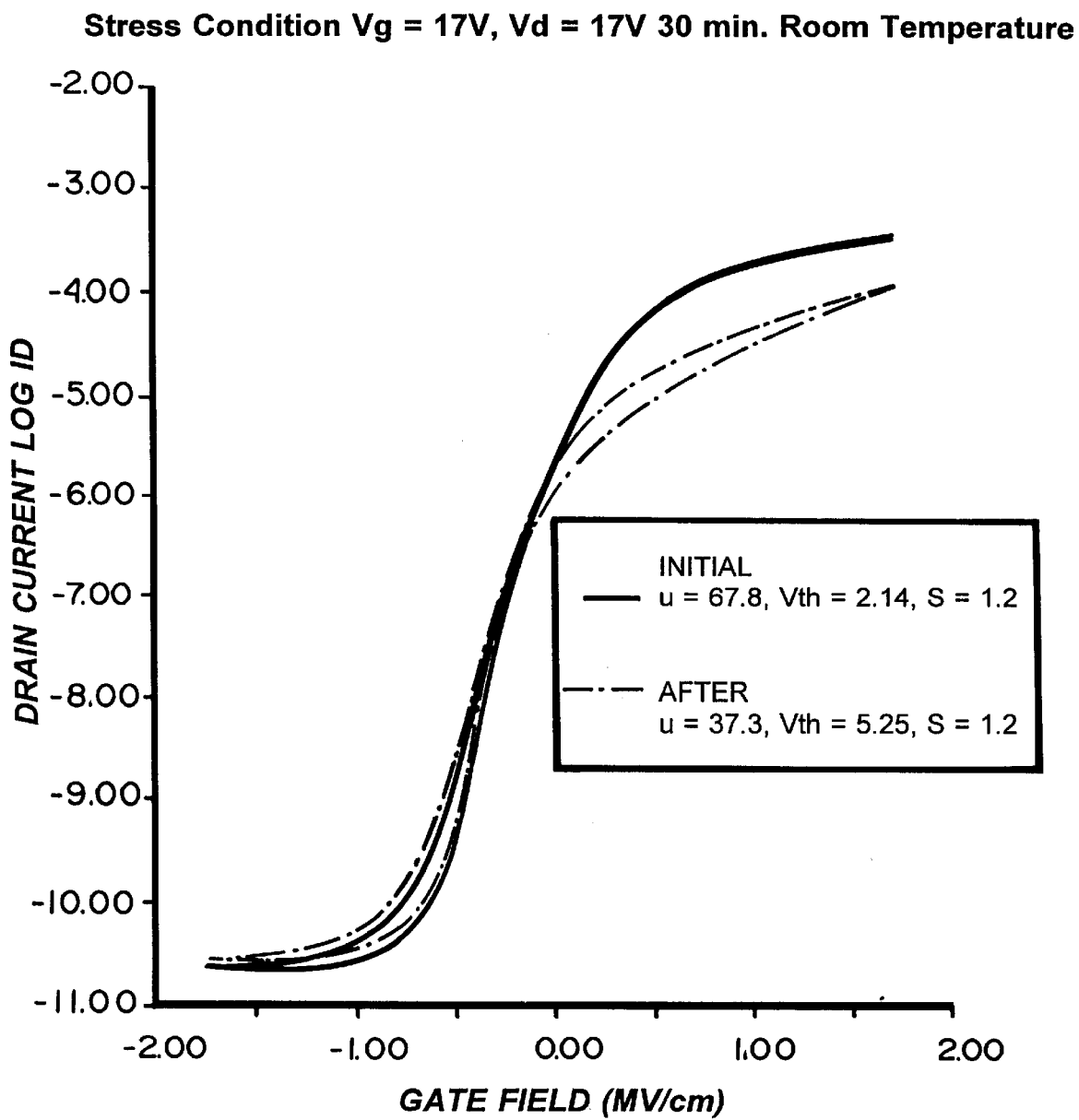
FIG. 10A and FIG. 10B are graphs showing results of reliability tests for TFT characteristics.

FIG. 10A shows results when a $SiO_2$ film of a TFT is formed under a condition that the aforementioned displacement reaction is insufficient and the $SiO_2$ film includes OH groups. This is because the separation or remote position of the plasma with respect to the reaction zone is insufficient (i.e., plasma too close) and a $SiH_4$ gas is decomposed by disturbance of a plasma source when the $SiH_4$ is not sufficiently supplied in the chamber. As is understood from FIG. 10A, the drain current is sifted after subjecting to a stress condition.

Figure 10B:
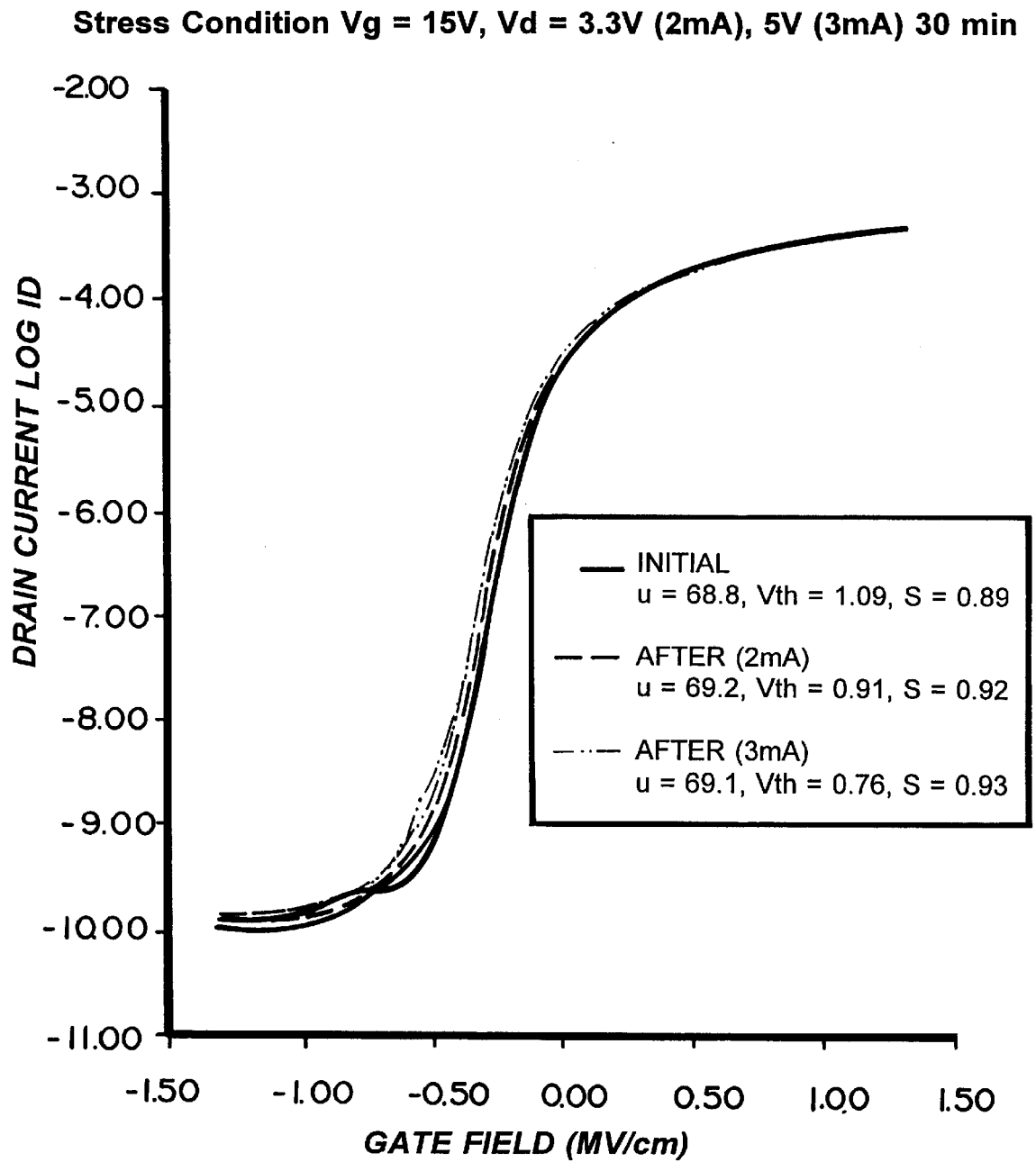

FIG. 10B, by contrast, shows a result in which a $SiO_2$ film is formed under a condition that the separation or remote position of the plasma from a reaction zone is sufficient and the aforementioned displacement reaction is sufficient. As is understood from FIG. 10B, the drain current is negligibly sifted after subjection to a stress condition.

STRUCTURE: MULTI-SOURCE REACTOR

Figure 9:
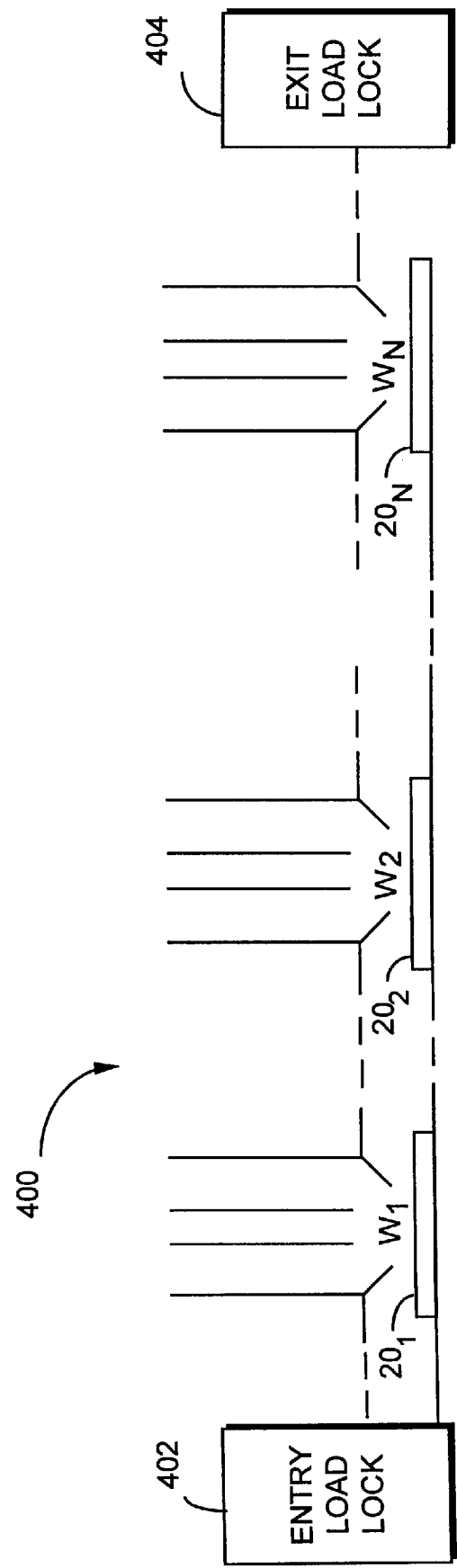
FIG. 9 illustrates a multi-stage plasma reactor having a plurality of reaction sections.

FIG. 9 illustrates a reactor 400 having an entry load lock 402 and an exit load lock 404. Reactor 400 comprises a plurality of reaction windows $W_1, W_2, \ldots W_N$. Wafer 20 is advantageously moved in direction 22 without being removed from reactor 400 between successive treatment steps. For example, when an ONO film (e.g., of a $SiO_2/Si_3N_4/SiO_2$ multi-layered film) is formed, $O_2$ is used as an excited gas in a first film-forming section of reactor 400 which includes zone $W_1$; $NH_4$ is employed as an excited gas in the second film-forming section of reactor 400 which includes zone $W_2$; and $O_2$ is used as an excited gas in a third film-forming section of reactor 400 which includes zone $W_3$. By moving wafer 20 along these first, second, and third sections of reactor 400, a satisfactory ONO film can be obtained.

As another example of utilization of reactor 400, it should be understood that a plurality of sections can perform the same treatment and thereby result in faster translation of wafers and faster throughput. Moreover, reactor 400 is advantageous for throughput matching (e.g., determining a desired uniform time interval of treatment for all sections and then determining a suitable number of sections required to perform each selected treatment in view of the uniform time interval).

It should be understood that a multi source reactor 400 of the present invention can utilize, for its differing sections, sources 24 of the embodiment of FIG. 1 or sources 25 of the embodiment of FIG. 5, or a combination of sources 24 and 24'.

Thus, the line plasma sources 24 and 24' of the present invention uses a remote plasma method in which plasma 30 is remote from reaction zone W, thereby alleviating damage to wafer surface 20S. Furthermore, since only gas required to be excited can be efficiently excited by the remote plasma method, the composition of the thin films to be formed on the substrate is controlled, resulting in production of high quality thin films with high density. Moreover, formation of thin films over a large flat substrate is facilitated by line plasma source 24 under which wafer 20 is moved at a constant speed in a direction perpendicular to plasma chamber outlet aperture 36.

Advantageously, unlike prior art systems, line plasma sources 24 and 24' of the present invention do not require temperatures of at least 600° C. (and more likely of at least 700° C.) in order to remove hydrogen from SiOH. Rather, by remote positioning of plasma 45 according to the present invention, the hydrogen is readily removed by a chemical displacement reaction and $SiH_4$ is not decomposed with a plasma electric potential. This results in a $SiO_2$ film containing less hydrogen, which is stable in terms of its composition. Furthermore, whereas conventional parallel plate type plasma phase deposition apparatus typically re-excited reaction by-products such as hydrogen and water, and these by-products are taken into the SiO film to deteriorate the quality of the $SiO_2$ film, such problems are eliminated (e.g., by the exhaust system 100 and the remote source configuration) in the present invention. For example, the present invention provides a flowing system which sweeps process by-products out of reaction zone W so that the reaction products cannot diffuse (e.g., into the wafer surface or into the source). The present invention with line apertures 36, and 112L, 112R facilitates an engineerable flow field at very large (transverse dimensions) that allows control of by-product activation at extremely large sample dimensions.

In accordance with the present invention, the composition of thin films to be formed on a semiconductor substrate at low temperatures is advantageously controlled, and such thin films are uniformly formed over a two-dimensional area. Therefore, a semiconductor device to be produced by using the thin films is functionally stable. The aspect ratios of the line plasma source provide an essentially one dimensional flow field that allows control of both reactant distribution in and by-product out in a way that is relatively insensitive to size of the wafer 20, and thus is suitable for use with large substrates. Moreover, by keeping the total cross-sectional area of the line plasma source small (in the X direction), flow velocity can be kept high for controlling the active species.

Furthermore, according to one embodiment of the invention, a plurality of thin films can be formed on a substrate in successive manner using a plurality of line plasma sources without removal of the substrate between depositions of thin film. Such successive formation guards against introduction of impurities at the interface between thin films, resulting in a multilayered film of high quality.

While the invention has been particularly shown and described with reference to the preferred embodiments thereof, it will be understood by those skilled in the art that various alterations in form and detail may be made therein without departing from the spirit and scope of the invention. For example, source 24 of the embodiment of FIG. 1 may be inverted in similar manner to source 24' of the embodiment of FIG. 5.

The embodiments of the invention in which an exclusive property or privilege is claimed are defined as follows:

1. A plasma source of the type including a plasma chamber with an electric field generator for generating an electric field in the plasma chamber; wherein the improvement comprises:

the plasma chamber is configured so that a radiative volume of the plasma is remotely situated from the surface to be treated, the radiative volume of the plasma being separated in the plasma chamber from an outlet aperture of the plasma chamber by a drift region, the outlet aperture being a long narrow outlet aperture, the active species exiting the plasma chamber through the long narrow outlet aperture in the plasma chamber, the outlet aperture being positioned closer to the surface to be treated than to the radiative volume of the plasma.

2. The apparatus of claim 1, wherein the long narrow outlet aperture has its longest dimension along a wafer transverse dimension, the longest dimension of the outlet aperture exceeding an extent of the surface to be treated in the wafer transverse dimension.

3. The apparatus of claim 1, wherein the surface to be treated is a polycrystalline silicon.

4. The apparatus of claim 1, further comprising a long narrow exhaust inlet aperture extending adjacent and parallel to the outlet aperture in the plasma chamber for exhausting by-products.

5. The apparatus of claim 1, further comprising first and second long narrow exhaust inlet apertures extending adjacent and parallel to the outlet aperture in the plasma chamber for exhausting by-products, the outlet aperture in the plasma chamber being situated between the first and second exhaust inlet apertures.

6. The apparatus of claim 1, wherein a distance D separates the surface to be treated from a radiative volume of the plasma, and wherein D is between 6 and 12 mean free paths of the active species.

7. The apparatus of claim 1, wherein the plasma chamber has a chamber housing, wherein a radiative volume of the plasma resides in top half of a chamber housing, and wherein the outlet aperture is situated at a bottom of a bottom half of the chamber housing.

8. The apparatus of claim 1, wherein the plasma chamber has a chamber housing, wherein the chamber has a drift region between a radiative volume of the plasma and the outlet aperture.

9. A plasma source of the type including a plasma chamber with an electric field generator for generating an electric field in the plasma chamber; wherein the improvement comprises:

the plasma chamber being configured so that a radiative volume of the plasma is separated in the plasma chamber from an outlet aperture of the plasma chamber by a drift region, the radiative volume being a portion of the plasma chamber wherein active species of the plasma are generated, the plasma chamber being further configured to accommodate plasma in an on-edge orientation relative to a surface to be treated, the plasma being situated in the plasma chamber remotely from the surface to be treated, the plasma chamber having an outlet aperture which is positioned closer to the surface to be treated than to the radiative volume of the plasma.

10. The apparatus of claim 9, wherein an aspect ratio of (1) a length of a projection of the plasma on a plane parallel to the surface to be treated to (2) a length of a projection of the plasma on a plane perpendicular to the surface is in a range of from about 1:3 to 1:10.

11. The apparatus of claim 9, wherein the outlet aperture is a long narrow aperture, and wherein active species of the plasma exits the plasma chamber through the outlet aperture.

12. The apparatus of claim 11, wherein the long narrow outlet aperture of the plasma chamber is provided in an outlet aperture plane parallel to a plane of the surface to be treated.

13. The apparatus of claim 11, further comprising a long narrow exhaust inlet aperture extending adjacent and parallel to the outlet aperture in the plasma chamber for exhausting by-products.

14. The apparatus of claim 11, further comprising first and second long narrow exhaust inlet apertures extending adjacent and parallel to the outlet aperture in the plasma chamber for exhausting by-products, the outlet aperture in the plasma chamber being situated between the first and second exhaust inlet apertures.

15. The apparatus of claim 9, wherein the plasma chamber is configured essentially as a narrow elongated rectangular volume having an open one of its faces as the chamber outlet aperture.

16. The apparatus of claim 15, wherein a plane including major dimension of the rectangular volume is nonorthogonally inclined relative to the surface to be treated.

17. The apparatus of claim 9, wherein the surface to be treated is a polycrystalline silicon.

18. A line plasma source comprising:

a plasma chamber, the plasma chamber housing therein a radiative volume of the plasma and a drift region, the radiative volume being a portion of the plasma chamber wherein active species of the plasma are generated, the drift region separating the radiative volume of the plasma from an outlet aperture of the plasma chamber, the plasma chamber being configured to accommodate the plasma thereof in an on-edge and remote orientation relative to a surface of to be treated;

a field applicator for generating an electric field in the plasma chamber;

an excitable gas supply conduit for supplying an excitable gas to the plasma chamber;

a reactive gas supply conduit for supplying a reactive gas to the drift region of the plasma chamber; and wherein the outlet aperture is positioned closer to the surface to be treated than to the radiative volume of the plasma.

19. The apparatus of claim 18, wherein the outlet aperture is a long narrow aperture, and wherein active species of the plasma exits the plasma chamber through the outlet aperture.

20. The apparatus of claim 19, further comprising a long narrow exhaust inlet aperture extending adjacent and parallel to the outlet aperture in the plasma chamber for exhausting by-products.

21. The apparatus of claim 19, further comprising first and second long narrow exhaust inlet apertures extending adjacent and parallel to the outlet aperture in the plasma chamber for exhausting by-products, the outlet aperture in the plasma chamber being situated between the first and second exhaust inlet apertures.

22. The apparatus of claim 19, wherein the long narrow outlet aperture is situated in an outlet aperture plane parallel to a plane of the surface to be treated.

23. The apparatus of claim 18, wherein the plasma chamber is configured essentially as a narrow elongated rectangular volume having an open one of its faces as the chamber outlet aperture.

24. The apparatus of claim 23, wherein a plane including major dimension of the rectangular volume is non-orthogonally inclined relative to the surface to be treated.

25. The apparatus of claim 18, wherein the surface to be treated is a polycrystalline silicon.

26. The apparatus of claim 22, wherein a distance D separates the surface to be treated from a radiative volume of the plasma, and wherein D is between 6 and 12 mean free paths of the active species.

27. The apparatus of claim 22, wherein the plasma chamber has a chamber housing, wherein a radiative volume of the plasma resides in top half of a chamber housing, and wherein the outlet aperture is situated at a bottom of a bottom half of the chamber housing.

28. The apparatus of claim 22, wherein the plasma chamber has a chamber housing, wherein the chamber has a drift region between a radiative volume of the plasma and the outlet aperture.

29. A plasma reactor for fabricating semiconductor devices, the reactor comprising:
a plasma chamber having a long narrow chamber outlet aperture along a transverse dimension of the plasma chamber, active species of the plasma exiting the plasma chamber through the outlet aperture; and
a transport for conveying a semiconductor device in a transport direction perpendicular to the transverse dimension of the plasma chamber, whereby a surface of the semiconductor device is treated with the active species exiting from the chamber outlet aperture as the semiconductor device is transported past the chamber outlet aperture,
and further comprising a long narrow exhaust inlet aperture extending adjacent and parallel to the outlet aperture in the plasma chamber for exhausting by-products; and
wherein the outlet aperture is positioned closer to the surface of the semiconductor device than to a radiative volume of the plasma.

30. The apparatus of claim 29, wherein an extent of the chamber outlet aperture along the transverse direction exceeds an extent of the surface to be treated in the transverse dimension.

31. The apparatus of claim 29, wherein the plasma chamber is configured to accommodate plasma in an on-edge orientation relative to the surface to be treated, the plasma being situated in the plasma chamber remotely from the surface to be treated.

32. The apparatus of claim 29, further comprising another long narrow exhaust inlet aperture extending adjacent and parallel to the outlet aperture in the plasma chamber for exhausting by-products, the outlet aperture in the plasma chamber being situated between the exhaust inlet apertures.

33. The apparatus of claim 29, wherein the surface to be treated is a polycrystalline silicon.

34. The apparatus of claim 29, wherein a distance D separates the surface to be treated from a radiative volume of the plasma, and wherein D is between 6 and 12 mean free paths of the active species.

35. The apparatus of claim 29, wherein the plasma chamber has a chamber housing, wherein a radiative volume of the plasma resides in top half of a chamber housing, and wherein the outlet aperture is situated at a bottom of a bottom half of the chamber housing.

36. The apparatus of claim 29, wherein the plasma chamber has a chamber housing, wherein the chamber has a drift region between a radiative volume of the plasma and the outlet aperture.

37. A plasma source of the type including a plasma chamber with an electric field generator for generating an electric field in the plasma chamber; wherein the improvement comprises:
the plasma chamber is configured so that a radiative volume of the plasma wherein active species of the plasma are generated is separated in the plasma chamber from an outlet aperture of the plasma chamber by a drift region, whereby the plasma is remotely situated from the surface to be treated and the active species travels through a passage that is non-orthogonally inclined relative to surface to be treated with the active species, and wherein the plasma chamber has an outlet aperture which is positioned closer to the surface to be treated than to a radiative volume of the plasma.

38. The apparatus of claim 37, wherein the plasma chamber is configured to accommodate plasma in an on-edge orientation relative to the surface to be treated.

39. The apparatus of claim 37, wherein the outlet aperture is a long narrow aperture, and wherein active species of the plasma travels through the inclined passage to exit the plasma chamber through the outlet aperture.

40. The apparatus of claim 39, further comprising a long narrow exhaust inlet aperture extending adjacent and parallel to the outlet aperture in the plasma chamber for exhausting by-products.

41. The apparatus of claim 39, further comprising first and second long narrow exhaust inlet apertures extending adjacent and parallel to the outlet aperture in the plasma chamber for exhausting by-products, the outlet aperture in the plasma chamber being situated between the first and second exhaust inlet apertures.

42. The apparatus of claim 37, wherein the surface to be treated is a polycrystalline silicon.

43. The apparatus of claim 39, wherein a distance D separates a surface to be treated from a radiative volume of the plasma, and wherein D is between 6 and 12 mean free paths of the active species.

44. The apparatus of claim 39, wherein the plasma chamber has a chamber housing, wherein a radiative volume of the plasma resides in top half of a chamber housing, and wherein the outlet aperture is situated at a bottom of a bottom half of the chamber housing.

45. The apparatus of claim 39, wherein the plasma chamber has a chamber housing, wherein the chamber has a drift region between a radiative volume of the plasma and the outlet aperture.

46. A method of preparing a semiconductor device by reacting a surface thereof in a plasma reactor, the method comprising:
generating active species of a plasma in a radiative volume of a plasma chamber whereby the plasma is remote from the surface to be treated;
emitting the active species of the plasma through a narrow elongated outlet aperture of the plasma chamber for reaction with the surface of the semiconductor device, the outlet aperture being positioned closer to the surface of the semiconductor device than to the radiative volume of the plasma.

47. The method of claim 46, wherein the plasma is generated so as to be configured in an on-edge orientation relative to a surface to be treated.

48. The method of claim 46, wherein the surface to be treated is heated to a low temperature less than 600° C.

49. The method of claim 46, wherein a dominant active species is the singlet delta state of molecular oxygen.

50. The method of claim 46, further comprising transporting the surface to be treated past the outlet aperture of the plasma chamber for exposing successive portions of the surface to be treated with the active species.

51. The method of claim 50, wherein the surface to be treated is transported past the outlet aperture of the plasma chamber in a transport direction, the transport direction being perpendicular to an elongated dimension of the outlet aperture of the plasma chamber.

52. The method of claim 46, further comprising introducing a silane in to the plasma chamber and using the silane and the active species to displace hydrogen at the surface to be treated.

53. The method of claim 52, wherein the displacement of hydrogen is in accordance with a displacement reaction Si—OH +SiH$_4$→H$_2$+Si—O—SiH$_3$.

54. The method of claim 52, wherein a dominant active species is the singlet delta state of molecular oxygen.

55. The method of claim 52, further comprising evacuating the hydrogen displaced from the surface to be treated.

56. The method of claim 55, wherein the hydrogen displaced is evacuated through an exhaust inlet aperture adjacent the outlet aperture of the plasma chamber.

57. The method of claim 46, wherein the surface to be treated is a polycrystalline silicon.

58. The method of claim 46, wherein a distance D separates the surface to be treated from a radiative volume of the plasma, and wherein D is between 6 and 12 mean free paths of the active species.

59. The method of claim 46, wherein the plasma chamber has a chamber housing, wherein a radiative volume of the plasma resides in top half of a chamber housing, and wherein the outlet aperture is situated at a bottom of a bottom half of the chamber housing.

60. The method of claim 46, wherein the plasma chamber has a chamber housing, wherein the chamber has a drift region between a radiative volume of the plasma and the outlet aperture.

61. A method of preparing a semiconductor device by reacting a surface thereof in a plasma reactor, the method comprising:

generating a plasma in a plasma chamber, a radiative volume of the plasma being separated in the plasma chamber by a drift region from an outlet of the plasma chamber whereby the plasma is remote from the surface to be treated and in an on-edge configuration relative to the surface to be treated, the radiative volume being a portion of the plasma chamber wherein active species of the plasma are generated, the outlet aperture being positioned closer to the surface to be treated than to the radiative volume of the plasma;

exposing the surface to be treated with active species of the plasma;

heating the surface to be treated to a low temperature less than 600° C.

62. The method of claim 61, wherein the is outlet aperture of the plasma chamber is a narrow elongated aperture.

63. The method of claim 61, wherein the dominant active species is the singlet delta state of molecular oxygen.

64. The method of claim 61, further comprising transporting the surface to be treated past the outlet aperture of the plasma chamber for exposing successive portions of the surface to be treated with the active species.

65. The method of claim 64, wherein the outlet aperture of the plasma chamber is a long narrow outlet aperture, and wherein the surface to be treated is transported past the outlet aperture of the plasma in a transport direction, the transport direction being perpendicular to an elongated dimension of the outlet aperture of the plasma chamber.

66. The method of claim 61, further comprising introducing a silane in to the plasma chamber and using the silane and the active species to displace hydrogen at the surface to be treated.

67. The method of claim 66, wherein the displacement of hydrogen is in accordance with a displacement reaction Si—OH +SiH$_4$→H$_2$+Si—O—SiH$_3$.

68. The method of claim 66, wherein the dominant active species is the singlet delta state of molecular oxygen.

69. The method of claim 66, further comprising evacuating the hydrogen displaced from the surface to be treated.

70. The method of claim 69, wherein the hydrogen displaced is evacuated through a port adjacent the outlet aperture of the plasma chamber.

71. The method of claim 61, wherein the surface to be treated is a polycrystalline silicon.

72. The method of claim 62, wherein a distance D separates the surface to be treated from a radiative volume of the plasma, and wherein D is between 6 and 12 mean free paths of the active species.

73. The method of claim 62, wherein the plasma chamber has a chamber housing, wherein a radiative volume of the plasma resides in top half of a chamber housing, and wherein the outlet aperture is situated at a bottom of a bottom half of the chamber housing.

74. The method of claim 62, wherein the plasma chamber has a chamber housing, wherein the chamber has a drift region between a radiative volume of the plasma and the outlet aperture.

75. A method of preparing a semiconductor device by reacting a surface thereof in a plasma reactor, the method comprising:

generating a plasma in a plasma chamber, a radiative volume of the plasma being separated in the plasma chamber by a drift region from an outlet of the plasma chamber, the radiative volume being a portion of the plasma chamber wherein active species of the plasma are generated, the outlet aperture being positioned closer to the surface to be treated than to the radiative volume of the plasma;

introducing a silane into the plasma chamber;

exposing the surface to be treated with active species of the plasma and the silane;

using the silane and the active species to displace hydrogen at the surface to be treated.

76. The method of claim 75, wherein the displacement of hydrogen is in accordance with a displacement reaction: Si—OH+SiH$_4$→H$_2$+Si—O—SiH$_3$.

77. The method of claim 75, wherein the dominant active species is the singlet delta state of molecular oxygen.

78. The method of claim 75, further comprising evacuating the hydrogen displaced from the surface to be treated.

79. The method of claim 78, wherein the hydrogen displaced is evacuated through an exhaust inlet aperture adjacent the outlet aperture of the plasma chamber.

80. The method of claim 75, wherein the surface to be treated is heated to a low temperature less than 600° C.

81. The method of claim 75, wherein the surface to be treated is a polycrystalline silicon.

82. The method of claim 79, wherein a distance D separates the surface to be treated from a radiative volume of the plasma, and wherein D is between 6 and 12 mean free paths of the active species.

83. The method of claim 79, wherein the plasma chamber has a chamber housing, wherein a radiative volume of the plasma resides in top half of a chamber housing, and wherein the outlet aperture is situated at a bottom of a bottom half of the chamber housing.

84. The method of claim 79, wherein the plasma chamber has a chamber housing, wherein the chamber has a drift region between a radiative volume of the plasma and the outlet aperture.

85. A plasma method of treating a layer on a polycrystalline silicon surface of a semiconductor device, the method comprising:
generating a plasma in a plasma chamber whereby the plasma is remote from the polycrystalline silicon surface, a radiative volume of the plasma being separated in the plasma chamber by a drift region from an outlet of the plasma chamber, the radiative volume being a portion of the plasma chamber wherein active species of the plasma are generated, the outlet aperture being positioned closer to the surface to be treated than to the radiative volume of the plasma;
introducing a reaction gas into the plasma chamber;
exposing the surface to be treated with active species and with the reaction gas;
heating the surface to be treated to a low temperature less than 600° C.;
using the reaction gas and the active species both to treat the layer and to displace hydrogen at the polycrystalline silicon surface.

86. The method of claim 85, wherein the reaction gas is a silane.

87. The method of claim 85, wherein the treating is one of etching, cleaning, oxidizing, or forming a deposition on the surface to be treated.

88. The method of claim 85, wherein the plasma is generated to have an on-edge configuration relative to the polycrystalline silicon surface.

89. The method of claim 85, wherein the outlet aperture through which the surface to be treated is exposed is a narrow elongated outlet aperture.

90. The method of claim 85, wherein the dominant active species is the singlet delta state of molecular oxygen.

91. The method of claim 85, further comprising transporting the surface to be treated past the outlet aperture of the plasma chamber for exposing successive portions of the surface to be treated with the active species.

92. The method of claim 91, wherein the outlet aperture of the plasma chamber is a long narrow outlet aperture, and wherein the surface to be treated is transported past the outlet aperture of the plasma chamber in a transport direction, the transport direction being perpendicular to an elongated dimension of the outlet aperture of the plasma chamber.

93. The method of claim 85, wherein the displacement of hydrogen is in accordance with a displacement reaction $Si-OH + SiH_4 \rightarrow H_2 + Si-O-SiH_3$.

94. The method of claim 93, wherein the dominant active species is the singlet delta state of molecular oxygen.

95. The method of claim 85, further comprising evacuating the hydrogen displaced from the surface to be treated.

96. The method of claim 95, wherein the hydrogen displaced is evacuated through a port adjacent the outlet aperture of the plasma chamber.

97. The method of claim 85, wherein the semiconductor device is a thin film transistor.

98. A method of operating a plasma reactor for depositing a layer on a layer of a semiconductor device, the plasma reactor having a plasma chamber wherein a radiative volume of the plasma is separated in the plasma chamber by a drift region from an outlet of the plasma chamber, the radiative volume being a portion of the plasma chamber wherein active species of the plasma are generated, the outlet aperture being positioned closer to a surface to be treated than to the radiative volume of the plasma, the plasma reactor further having a field applicator for coupling an electric field to the plasma, the method comprising setting a frequency of the field applicator to obtain a predetermined figure of merit for the deposition of a desirable quality of the layer, the figure of merit being obtained by dividing a voltage across the drift region by a number of mean free paths.

99. A line plasma vapor phase deposition apparatus comprising:
plasma generating portion including a plurality of line-shaped electrodes and a high frequency power source for supplying a high frequency current to the electrodes;
a plasma gas supply portion for allowing a predetermined gas to flow in a predetermined amount to the plasma generating portion;
a reaction gas supply portion for supplying a predetermined reaction gas, positioned at a predetermined distance from the plasma generating portion;
a reaction portion in a line shape for allowing the plasma gas to be reacted with the reaction gas, the reaction portion having an outlet aperture which is positioned closer to a substrate to be treated than to a radiative volume of the plasma, the radiative volume being a portion of the plasma chamber wherein active species of the plasma are generated, the radiative volume of the plasma being separated by a drift region from the outlet aperture;
an exhaust portion for exhausting the reacted gas; and
a substrate moving mechanism for moving the substrate to be treated, on which the reaction gas is to be deposited, in a direction perpendicular to the reaction portion in a line shape under the conditions that the substrate to be treated is kept at a predetermined temperature and kept close to the reaction portion.

100. A line plasma vapor phase deposition apparatus for treating a surface to be treated of a semiconductor device, the apparatus comprising:
a plasma chamber housing, the plasma chamber housing having an essentially long, narrow rectangularly shaped outlet aperture in a sample-proximate walls, the outlet aperture being positioned closer to a surface to be treated than to a radiative volume of the plasma;
a plasma gas manifold for supplying a predetermined gas into the plasma chamber housing;
an ionizing electric field applicator positioned external to the plasma housing for generating a radiative volume of plasma in the housing, the radiative volume being separated in the plasma chamber housing from the outlet aperture by a drift region, active species of the plasma being incident on the surface to be treated through the outlet aperture;
an exhaust system, the exhaust system including an essentially long, narrow rectangularly shaped exhaust aperture positioned above the surface to be treated.

* * * * *